United States Patent [19]

Fifield et al.

[11] Patent Number: 5,022,006

[45] Date of Patent: Jun. 4, 1991

[54] SEMICONDUCTOR MEMORY HAVING BIT LINES WITH ISOLATION CIRCUITS CONNECTED BETWEEN REDUNDANT AND NORMAL MEMORY CELLS

[75] Inventors: John A. Fifield, Jericho; Steven W. Tomashot, both of Jericho, Vt.

[73] Assignee: International Business Machines Corporation, Armonk, N.Y.

[21] Appl. No.: 175,883

[22] Filed: Apr. 1, 1988

[51] Int. Cl.$^5$ .................... G11C 7/00; G11C 11/407
[52] U.S. Cl. .................................... 365/200; 365/51; 371/10.3
[58] Field of Search ............... 365/200, 210, 230, 195, 365/230.06, 63, 51; 371/8, 10, 10.1, 10.2, 10.3

[56] References Cited

U.S. PATENT DOCUMENTS

| | | | |
|---|---|---|---|
| 4,365,319 | 12/1982 | Takemae | 365/200 |
| 4,389,715 | 6/1983 | Eaton et al. | 365/200 |
| 4,392,211 | 7/1983 | Nakano et al. | 365/200 |
| 4,498,154 | 2/1985 | Hoffman | 365/149 |
| 4,566,081 | 1/1986 | Ochii | 365/200 |
| 4,723,227 | 2/1988 | Murotani | 365/200 |
| 4,737,935 | 4/1988 | Wawersig et al. | 365/200 |
| 4,803,656 | 2/1988 | Takemae | 365/200 |
| 4,849,938 | 7/1989 | Furutani et al. | 365/200 |

OTHER PUBLICATIONS

Tolley et al, "72-k RAM Stands Up to Soft and Hard Errors", Electronics, vol. 55, No. 12, 6-16-82, pp. 147-151.
"Circuit Implementation of Fusible Redundant Addresses on RAMs For Productivity Enhancement", IBM Journal of Research and Development, vol. 24, No. 3, pp. 291-295, May 1980.
"Intel Application Description AP-131, pp. 14-16".
"An Analyusis of the i2164A", Mosaid Incorporated, pp. 5, 41-52, Apr. 1982.

Primary Examiner—Glenn Gossage
Attorney, Agent, or Firm—Howard J. Walter, Jr.

[57] ABSTRACT

A semiconductor memory device is described in which wordline redundancy is implemented without impacting the access time. A redundant decoder circuit generates a wordline drive inhibit signal which inhibits the generation of a normal wordline signal. Deselection also deselects the normally accessed reference cells, requiring that the redundant cells provide their own reference signal. This last requirement is accomplished by utilization of twin cells for the redundant memory. Placing the redundant memory cells on the sense node side of the bit line isolators enables the effective doubling of the number of redundant cells available each of a plurality of sub-arrays of normal memory.

4 Claims, 8 Drawing Sheets

SEMICONDUCTOR MEMORY HAVING BIT LINES WITH ISOLATION CIRCUITS CONNECTED BETWEEN REDUNDANT AND NORMAL MEMORY CELLS

BACKGROUND OF THE INVENTION

1. Technical Field

This invention relates to semiconductor memory systems and techniques for increasing effective production yield by the implementation of redundant memory cells, and particularly to the implementation of wordline redundancy.

2. Prior Art

The application of memory cell redundancy to enhance the yield of semiconductor memory arrays during the early stages of mass production is extensively practiced throughout the semiconductor industry. The classic problem encountered when implementing wordline redundancy is that of containing the address detection and word drive steering functions without increasing the time interval between word address generation and wordline drive. In high performance DRAM architecture there are normally four clock phases between the application of word address signals to the memory and the actual wordline drive phase. The first phase begins with the application of the word addresses to an input buffer circuit. The second is that of the address drive signal. The third phase drives both true and complement word address signals to the word decoders distributed across the memory chip. The fourth is that of the actual wordline drive phase which can be applied only after all of the unselected word decoders have responded to the true/complement address signals. The critical time during which the determination of whether to activate normal or redundant word lines lies between phases three and four, since the selection cannot be made until after the true/complement address signals have been evaluated. Except in those few instances described below, prior art techniques for implementing wordline redundancy require that the timing between these critical phases be increased considerably. Other techniques for obtaining wordline redundancy, although not presenting the same problem, have problems of their own.

Previous designs of wordline redundancy have been proposed at the expense of:

Increased chip area and circuit complexity caused by the use of independent columns of sense amplifiers and data line steering circuits operating in parallel with the normal array circuitry, and E. P. Thoma, "Circuit Implementation of Fusible Redundant Addresses on RAMs for Productivity Enhancement", *IBM Journal of Research and Development*, Vol. 24, No. 3, pp. 291–295, May, 1980. Here wordline redundancy is implemented without an access time penalty by adding separate sense amplifier columns for the redundant wordlines. No access penalty is incurred because the redundant wordline and the defective wordline operate in parallel, and the selection of the redundant, versus the normal sense amplifiers, occurs during the sensing operation. This approach is disadvantageous in that chip size is significantly increased due to the need for additional latches for each bitline along the redundant wordline.

U.S. Pat. No. 4,365,319, issued to Takemae on Dec. 21, 1982, implements redundancy by utilizing two kinds of decoders and drivers, i.e., a PROM decoder for determining whether an incoming address is a defective address, a redundancy driver for driving a redundancy array, and row address decoders and drivers for driving a main memory cell matrix. A first embodiment of the Takemae teachings (FIG. 1) is disadvantageous in that the switch 7 results in an access time penalty, and results in a semiconductor space penalty because the switch must be large to handle high currents. In a second embodiment (FIGS. 2–4), multiple AND gates $D_0$–$D_{63}$ replace the large switch 7 (FIG. 1); however, this is not much of an improvement because the memory device still suffers from both an access time (i.e., an AND-gate) penalty, and also a semiconductor space penalty as the collective area of the AND gates $D_0$–$D_{63}$ is still large. A third embodiment (FIGS. 5–10) suffers an access time penalty due to AND-gate delays introduced by the incorporation of AND gates $D_{91}$–$D_{94}$ (FIG. 6) and AND gates $D_0$–$D_3$ (FIG. 8A) to control the activation of the decoders and drivers 9 and 10, respectively.

The Intel 2164A 64K DRAM represents a memory device where access time is the same whether it is the normal wordlines or the redundancy wordlines which are being used; however, this product is always affected by an access time penalty, whether repaired with wordline redundancy or not, because chip timing is set up to allow for redundancy repairs. More specifically, chip performance is slowed due to the need to deselect a faulty wordline's word decoder after the redundant word decoders sense a match with an incoming address Once the match is sensed, a deselect generator is fired or triggered to deselect the entire row of normal word decoders. After the faulty wordline word decoder is deselected, then the wordline drive is enabled. Further discussions concerning the 2164A can be seen in the Intel Application Description AP-131, pp. 14–16, and "An Analysis of the i2164A," Mosaid Incorporated, p. 5, 41–52, April, 1982.

The 64K DRAM (described by R. T. Smith, J. D. Chlipala, J. F. M. Bindels, R. G. Nelson, F. H. Fischer and T. F. Mantz, in "Laser Programmable Redundancy and Yield Improvement in a 64K DRAM," *IEEE Journal of Solid-State Circuits*, Vol, SC-16, No. 5, pp. 506–514, October, 1981), and the 256K DRAM (described by C. A. Benevit, J. M. Cassard, K. J. Dimmler, A. C. Dumbri, M. G. Mound, F. J. Procyk, W. R. Rosenzweig and A. W. Yanof, in "A 256K Dynamic Random Access Memory," *IEEE Journal of Solid-State Circuits*, Vol. SC-17, No. 5, pp. 857–861, October, 1982), implement wordline redundancy without an access time impact by using laser-fused redundancy on the wordline pitch. No access time penalty is incurred because the defective wordline is permanently disconnected by an exploding programmable link provided in each of the wordline drive circuits. This method of redundancy is disadvantageous because the tighter design rules of present and future high density memory products are causing a shrinkage in the wordline pitch. The result is a requirement for a laser spot size and laser beam position accuracy beyond what is available from laser programming systems today. Thus, laser-fused redundancy is disadvantageous in that the current level of laser technology requires an off wordline pitch method or an increase in memory chip size due to the need for an increased wordline pitch.

Our copending U.S. application Ser. No. 176,473 filed Apr. 1, 1988, now U.S. Pat. No. 4,885,720, teaches a circuit and method of providing wordline redundancy without impact on access time at the expense of providing separate wordline driver circuits for the normal and redundant array cells. This design also requires excess power and complex circuitry to implement effectively.

Additional designs have also been described which include design trade-offs such as:

increased access time caused by driving both true and complement addresses signals high after redundant address compare circuitry has completed its function, see Eaton et al U.S. Pat. No. 4,389,715, issued June 21, 1983;

reduced array signal margin due to wordline signal glitches caused by partial selection and then deselection of normal wordline drive phase, see Nakano et al U.S. Pat. No. 4,392,211, issued July 5, 1983; and complex timing considerations caused by introducing an extra timing phase between word address drive time and wordline decode drive, see Murotani U.S. Pat. No. 4,723,277, issued Feb. 2, 1988.

While the above approaches represent important advances in semiconductor manufacturing technology, there still exists a need for a memory design approach which is capable of providing wordline redundancy without the disadvantages cited above, i.e., without any access time penalty, and without any significant impact on chip size and power requirements.

SUMMARY OF THE INVENTION

The present invention provides wordline redundancy without access time penalty and without the inherent design penalties of prior designs by utilizing the NOR voltage nodes of redundant decoder circuits in conjunction with an Exclusive NOR (ENOR) circuit to generate a wordline drive inhibit timing signal that prevents the normal wordline drive from being triggered whenever a redundant wordline decoder is selected. The outputs of a plurality of ENOR circuits are coupled to a common node which is applied to a drive stage. The output of the drive stage is coupled via a filter circuit to a wordline drive kill (VWKILL) voltage node. Application of a signal on the VWKILL node completely disables the entire normal wordline drive circuitry, including that of the reference or dummy cells, associated with the normal array. When a redundant wordline is selected the wordline drive phase is applied through the redundant wordline decoder selecting a redundant memory cell. The redundant memory cells are of the twin cell variety such that no separate reference cell is required. As a further improvement in wordline redundancy, the redundant memory cell array is physically coupled directly to the sense nodes of the sense amplifiers inside of the data or bit line isolator devices.

It is therefore an important object of the present invention to provide a semiconductor memory device with the capability of wordline redundancy without an access time penalty.

A second object of the invention is to provide a semiconductor memory device with wordline redundancy without a significant impact on memory chip size.

A third object is to provide a semiconductor memory device including wordline redundancy which has no significant impact on memory chip power requirements.

These and other objects and advantages of the invention will become more fully apparent from the following detailed description of the preferred embodiment, in conjunction with the accompanying drawings, wherein:

DETAILED DESCRIPTION OF THE PREFERRED EMBODIMENT OF THE INVENTION

Figure 1:
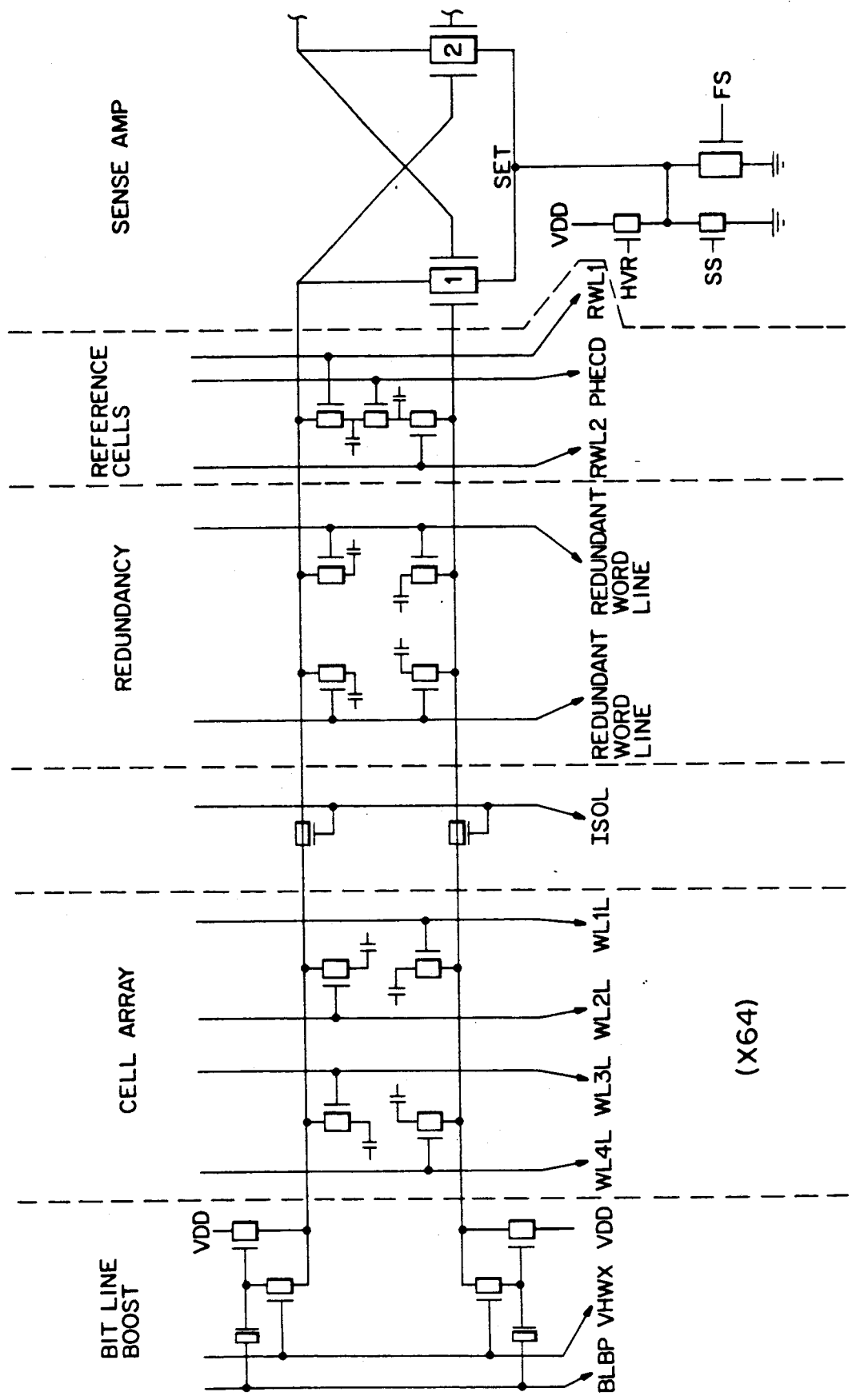
FIG. 1 is an overall circuit schematic view of an implementation of the invention showing the relationship of the normal and redundant memory arrays to the sensing circuit in the memory.
Figure 1:
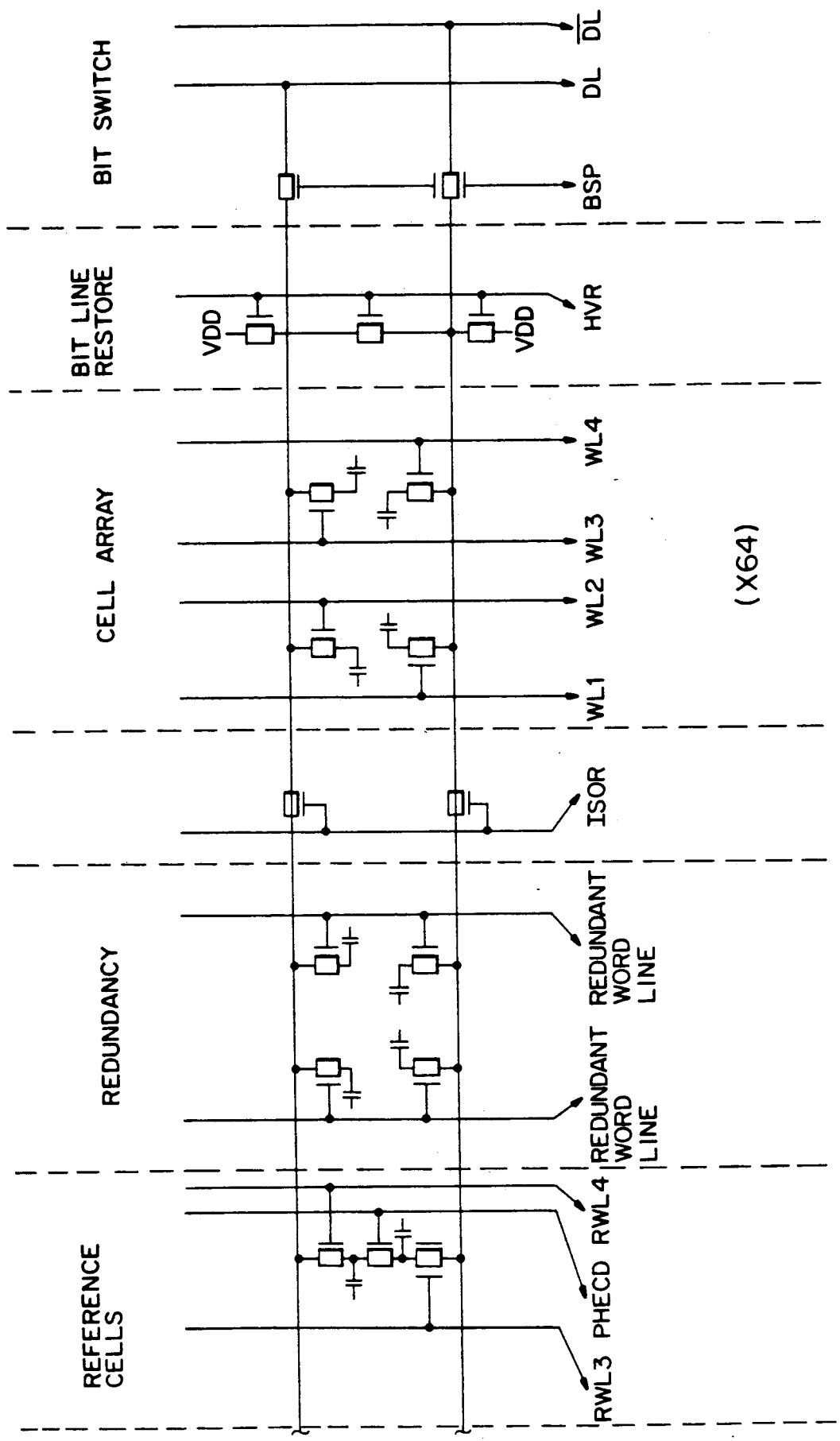

While those skilled in the art will already appreciate many of the aspects of memory circuit design and of redundancy implementation in general, some preliminary comments on these items is warranted.

In currently designed Dynamic Random Access (Read/Write) Memories (DRAMs) the time required for the memory to provide access for reading or writing of data in memory cells is dependent, at least for initial access in a particular memory, is known as "access time" and is of critical importance to the usefulness of the memory. Access time is dependent upon a number of events which must take place within the memory beginning with the application of a Row Access Strobe (RAS) signal to the memory. Application of RAS usually initiates application of word address signals to the memory. The address signals must, in most instances, be converted to both true and complementary address signals which can be applied to NOR decoder circuits which enable the selection of one of a plurality of wordlines within the memory array of the memory. Because the wordline decoders are physically distributed across a substantial portion of the memory, it is necessary that timing restraint be imposed on the operation of the memory device with regard to the wordline driver signal. This timing constraint arises because every word decoder has an inherent and unavoidable delay time before its switching operation can be guaranteed as having been "settled" or performed after receiving an address signal.

When wordline redundancy is to be implemented, as in the instant invention, without impacting the access time of the memory without redundancy, this timing for selection of the wordlines in the normal and redundant arrays cannot exceed that of the same memory designed without redundancy.

The following represents a brief description of the actual enabling of redundancy in a typical DRAM. At some point during manufacturing of the memory component, the main memory array is tested for defects. The physical location of defects are analyzed to determine if the replacement of certain specified wordlines will enable the memory to access its full complement of addressable memory cells. Defective portions (defined along a respective main memory wordline) of the main memory array, are "replaced" by a good portion (defined along a respective redundant memory wordline) in a redundant array. To accomplish this, the address of each defective main memory wordline is programmed into a redundant word decoder (using laser-blown fuses, electrically blown fuses, etc.) to become associated with a unique substitute wordline in the redundant array. The redundant word decoder compares incoming address signals with the programmed defective addresses and if a match is found to occur, the redundant word decoder performs its switching operation to select the appropriate redundant wordline as a substitute.

The choice of using redundancy by programming the redundant word decoders with the addresses of defective main memory wordlines, imposes an additional constraint upon the operation of the memory device which directly effects the memory access time. When an incoming address is a defective address, the main word decoder and the redundant word decoder attempt to simultaneously operate to select both a main memory wordline and a redundant memory wordline using the same address. As mentioned previously, in order for the implementation of wordline redundancy not to impact access time, it is necessary to contain the comparison of the wordline address in the redundant decoders and the deselection of the normal wordline drive circuit within the same time as it would take to make the selection of a normal or main wordline.

Referring now to FIG. 1, there is shown the relationship of a number of known circuit elements within the memory of the invention. While each of the identified sub-elements are well known and thus require no detailed description of operation, their specific relationship to each other is unique and requires explanation. Proceeding from left to right the following functional elements are provided:

a. A bitline boost circuit is placed at one extreme end of the folded bitline pair, the purpose of which is to enable the signals on the data or bit lines to be raised to the full level of drain supply Vdd.

b. Main cell array (left) comprising for each bit line pair a plurality of single device memory cells accessible by the normal array wordlines. The cell, array represents one-half of the total number of cells addressable by the memory.

c. A pair of bit line isolation devices responsive to the signal ISOL which enable the entire left half of the normal array to be electrically isolated from the sensing circuits.

d. A first redundant cell array comprising a redundant memory cell for each of a plurality of redundant wordlines. It should be noted that two distinct differences are present in connection with the redundant memory cells. First, these cells are placed on the sensing side of the isolator devices. That is, the redundant cell array is separated from the adjacent main array by the isolation devices. By so placing these redundant cells, each cell may be used as a replacement for any main array wordline regardless of in which array half (right or left) the defective wordline lies. This has the effect of doubling the maximum number of replaceable wordlines in each array half. Second, the redundant cell itself is of the type known as a twin cell since each cell is composed of two single device memory cells which store data signals complementary to each other. One of the reasons for using a twin cell is that the wordline redundancy scheme described herein disables the normal drive circuits for the reference cells.

e. Next, also within the region of the bit lines isolated by the bit line isolators, are the reference cells used for providing a reference signal to the sense amplifiers signal. The reference cells are of the known one-half voltage type and those to the left of the sense amplifier are selected for corresponding main array cells located on the right side of the memory.

f. The sensing circuit is of the standard cross-coupled variety and is coupled such that the bit lines can be multiplexed for sensing either the left or right main or normal array.

g. Next, reference cells associated with the left array are placed within the confines of the bit line isolators.

h. Additional redundant cells are placed physically to the right of the sense amplifiers, but are capable of replacing wordlines on either array half.

i. Isolators for the right array half.

j. Right array half.

k. Bit line restore circuitry for restoring the bit lines after an access cycle to their initial precharged state.

l. Finally, at the extreme right of the memory there are provided a pair of bit switches for coupling the true and complementary data lines DL to the bit lines within the array.

The particular advantages of arranging the elements in the particular sequence as described above will become clearer after the following description of the circuits used to implement the invention.

Figure 2:
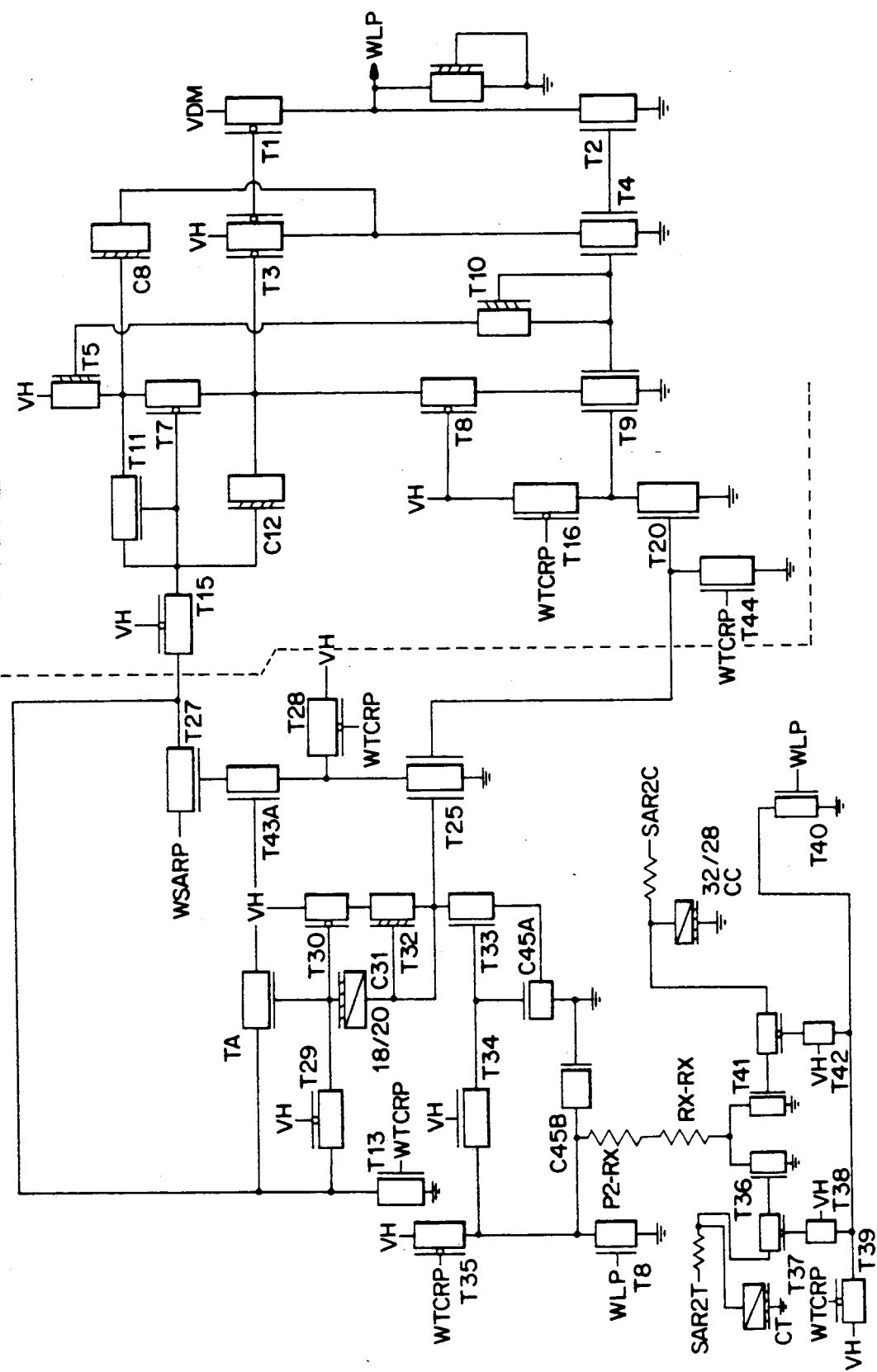
FIG. 2 is a circuit schematic showing the wordline drive initiation circuit for generating the signal WLP.

Referring now to FIG. 2 the schematic of the initial word drive phase WLP is described. The circuit is precharged by WSARP (the drive phase for the address true/complement generator) and triggered when one of the word address true or complement signals SAR2T and SAR2C, are applied to the conduction electrodes of T37 and T45 respectively, have risen enough to discharge a simulated word decode NOR node at the drain of T38 and T41. The WLP phase drives one of two first level word lines VW1 or VW2, which are used in turn to drive the reference word lines through the word and reference word decoders. It should be noted that the word drive clock or phase is generated unconditionally after the application of row address signals to the memory, assuming the memory has in fact been selected. The voltage designation VDM is an alternative designation for the drain supply voltage Vdd.

Figure 3:
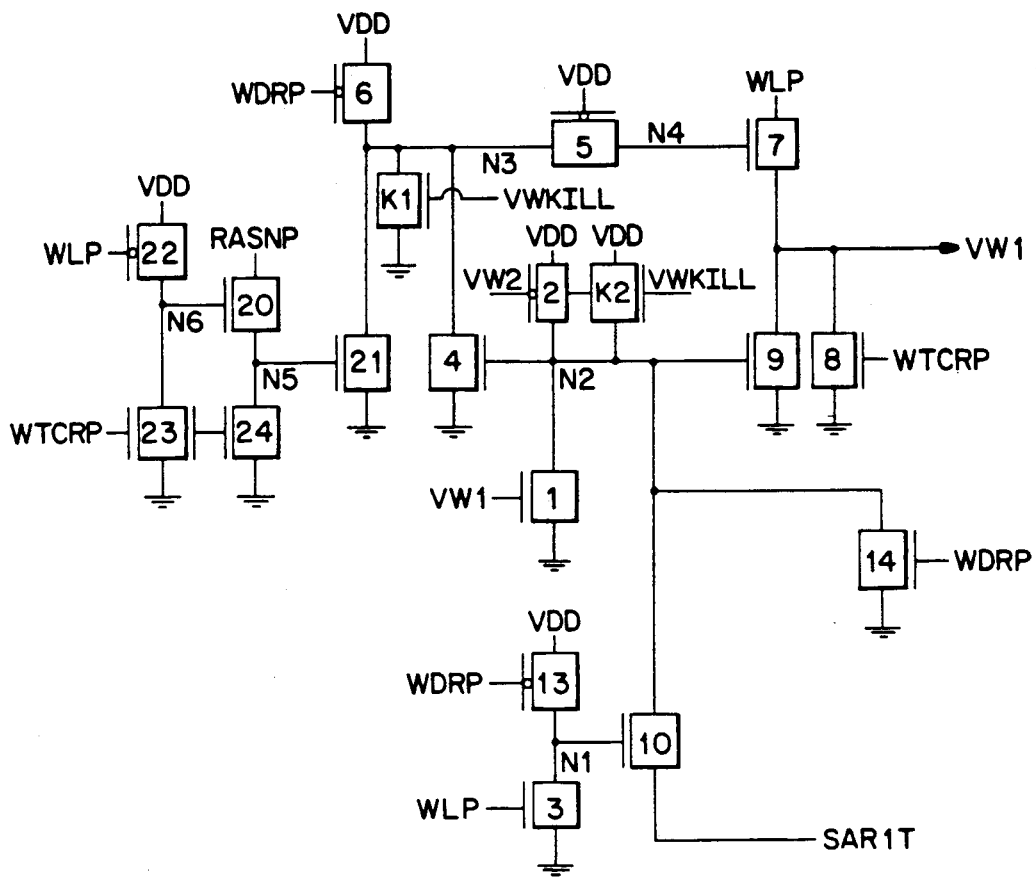
FIG. 3 is a circuit schematic showing the first decoder of the two level decode system which is responsive to the VWKILL signal of the wordline redundancy circuits to generate the signals VW1 and VW2.

FIG. 3 shows one of two nearly identical circuits used to generate the first level decode signal in response to word address input SAR1. The circuit shown generates the VW1 signal in response to the input SAR1T while another circuit (not shown) generates the signal VW2 in response to the input SAR1C. The circuit is precharged by signal WDRP charging the gate of T7 high during standby time. In normal operation, after the word address signals have been generated if the word address SARx coupled to the conductive electrode of T10 remains low, then when the word drive phase WLP rises the output VWx will follow. If the input SAR1T rises, devices (i.e. transistors) 9 and 4 will both conduct discharging both the precharged gate of device 7 and the output. Of particular significance is the presence of the input signal VWKILL. If the signal VWKILL rises before phase WLP, the gates of devices 9 and 4 will be clamped to Vdd such that after WLP rises the circuit will be disabled. Thus, VWKILL represents a means to disable the word drive signal from propagating to the word line driver circuit as will be shown below.

Figure 4:
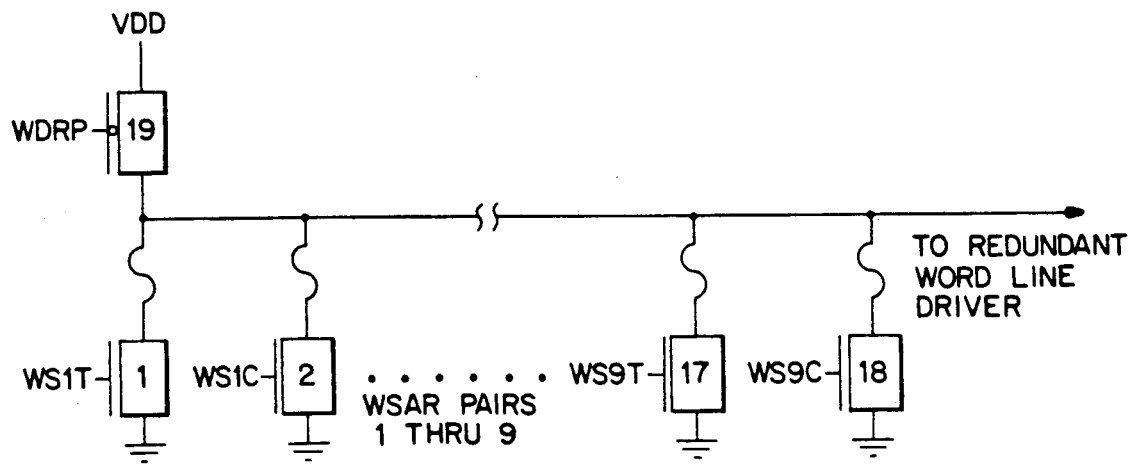
FIG. 4 is a circuit schematic showing the redundant wordline decoder circuit.

FIG. 4 shows the redundant decoder circuit which is a simple NOR decoder in which there have been placed fuses to enable the circuit to respond to any address combination desired.

Figure 5:
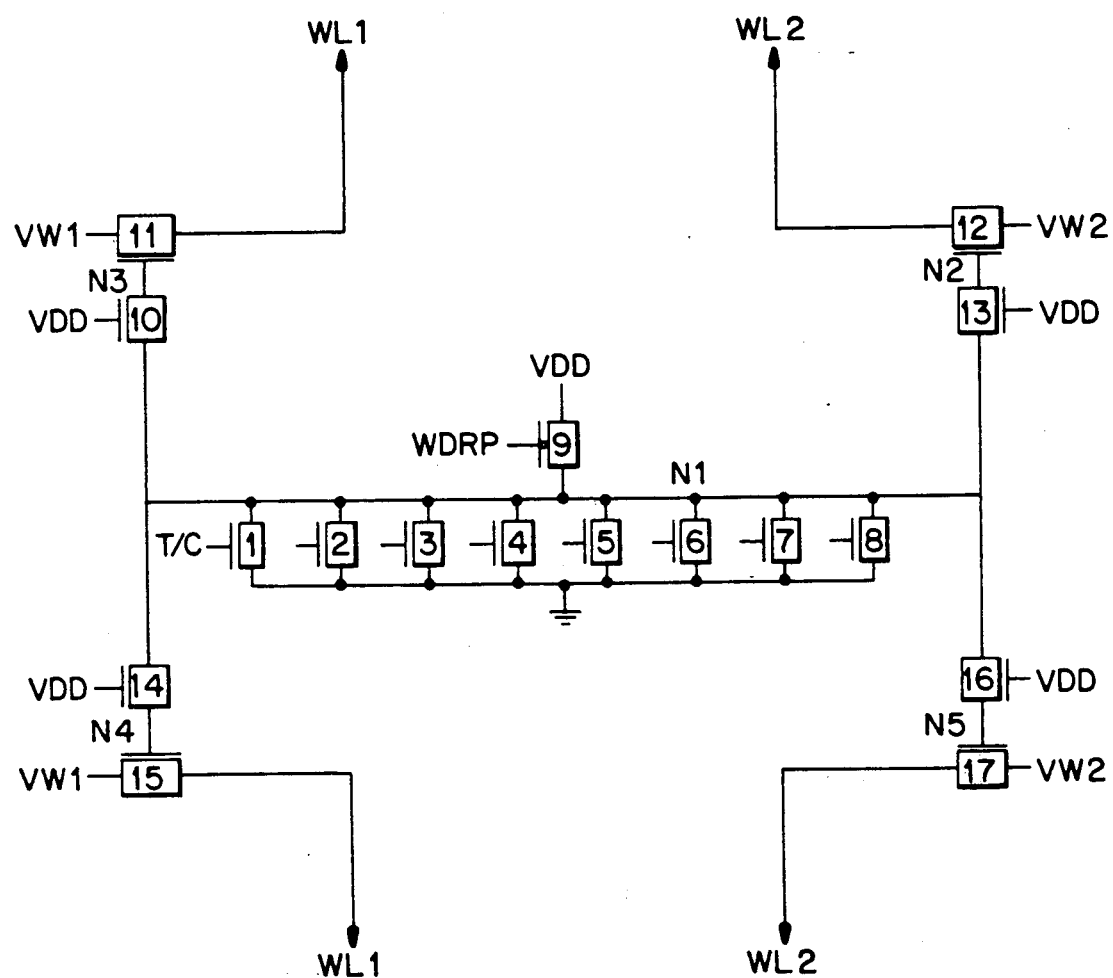
FIG. 5 is a circuit schematic showing the second level wordline decode circuit of the normal memory array which generates the wordline signals WL1 and WL2.

FIG. 5 shows the wordline decoder circuits of standard design. These circuits, of which there are as many as there are wordlines in the memory, are responsive to the applied true and complement (T/C) address signals to couple which ever one of VW1 and VW2 has been generated by the first level decoder.

Figure 6:
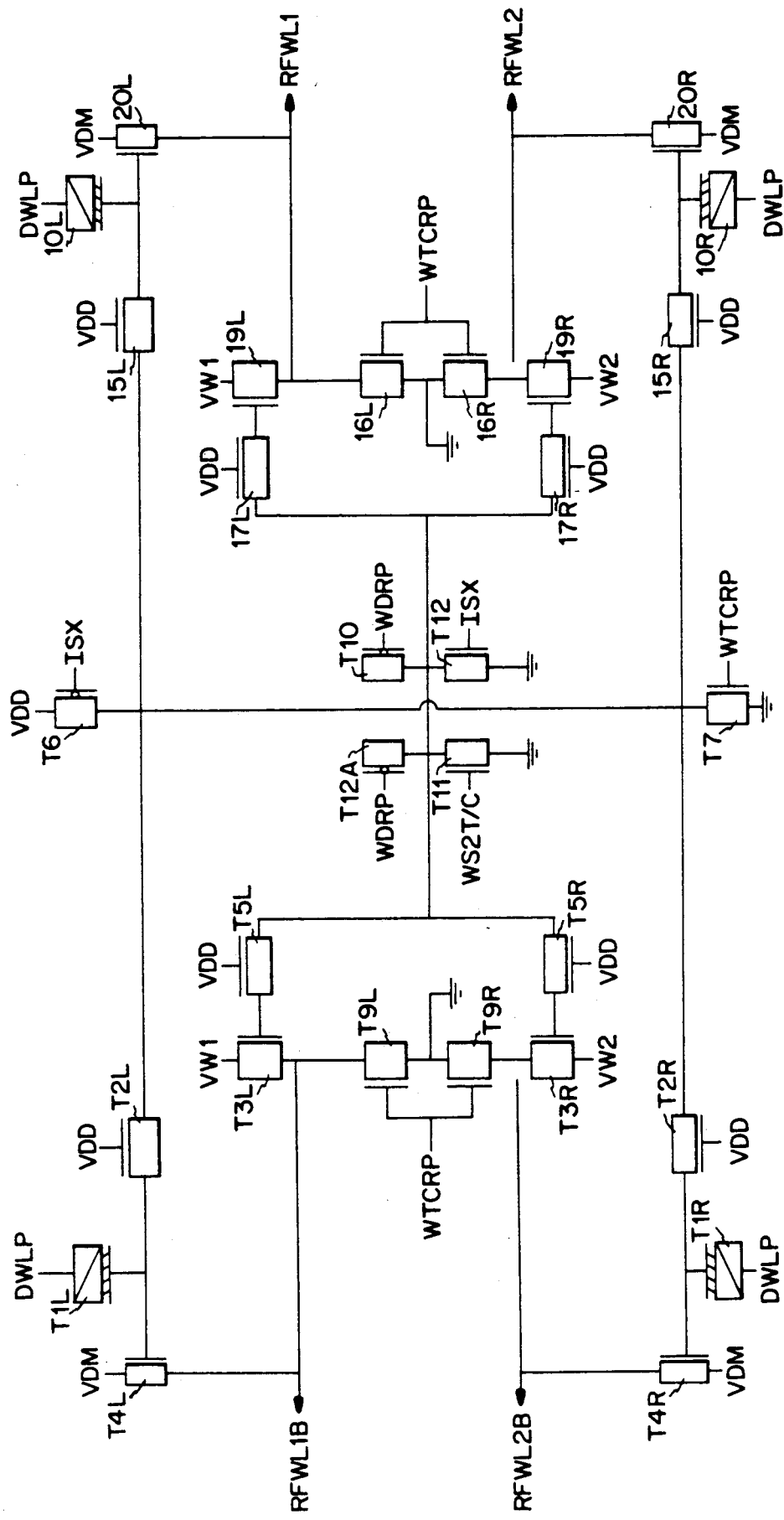
FIG. 6 is a circuit schematic showing the reference wordline decode circuit implemented at the second level of decoding which generates the signals RFWL1 and RFWL2.

FIG. 6 shows the reference wordline decoder which in response to both the phase VW1 or VW2 and the row address SAR2 (designated WS2T/C) generates the proper reference wordline signal to select a reference cell for the cells in the normal array. Recall that during selection of a redundant wordline, the output VWx is inhibited, and thus that of the reference wordline circuit as well.

Figure 7:
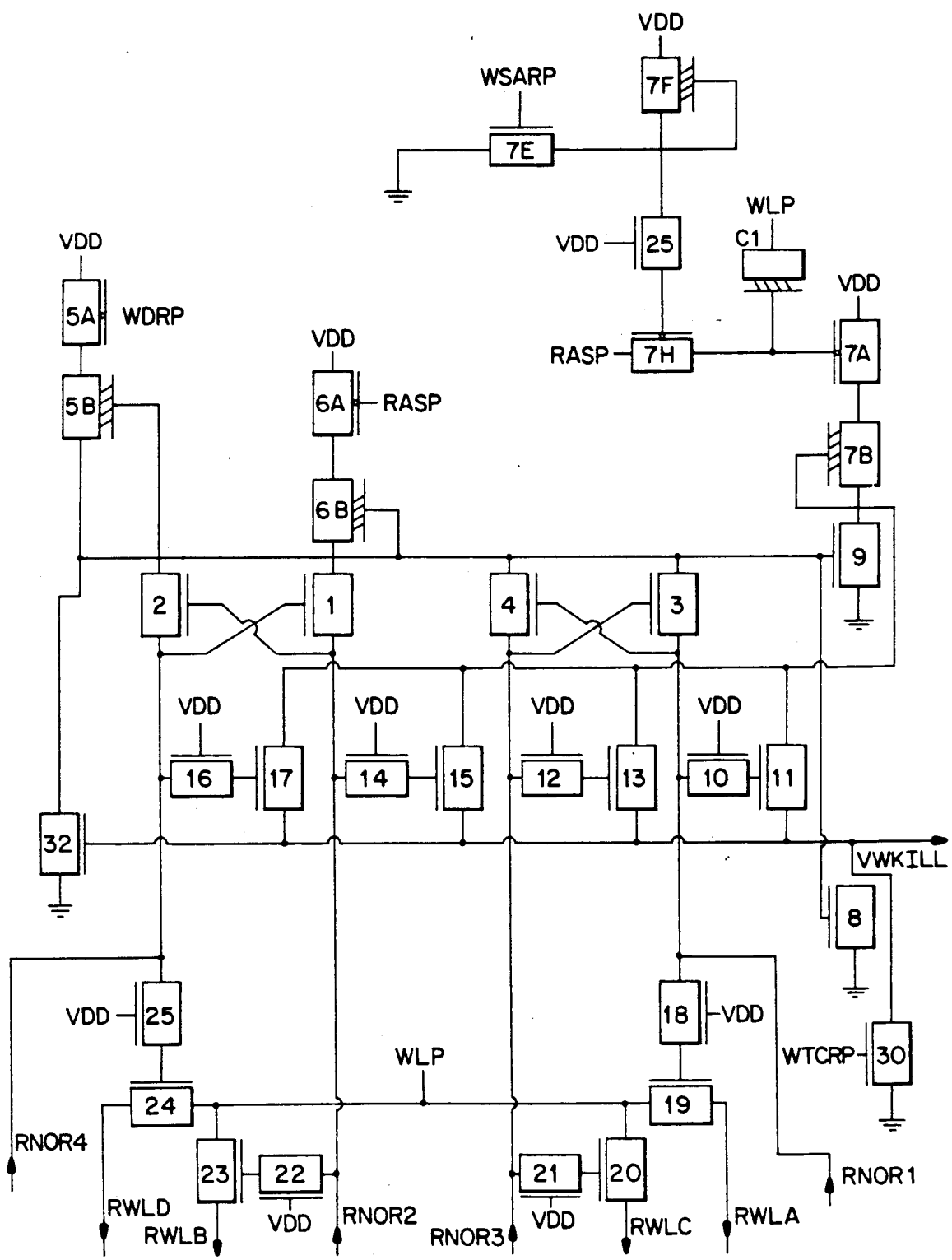
FIG. 7 is a circuit schematic showing the wordline redundancy circuits including the ENOR, driver and filter circuits used to generate the signal VWKILL.
Figure 8:
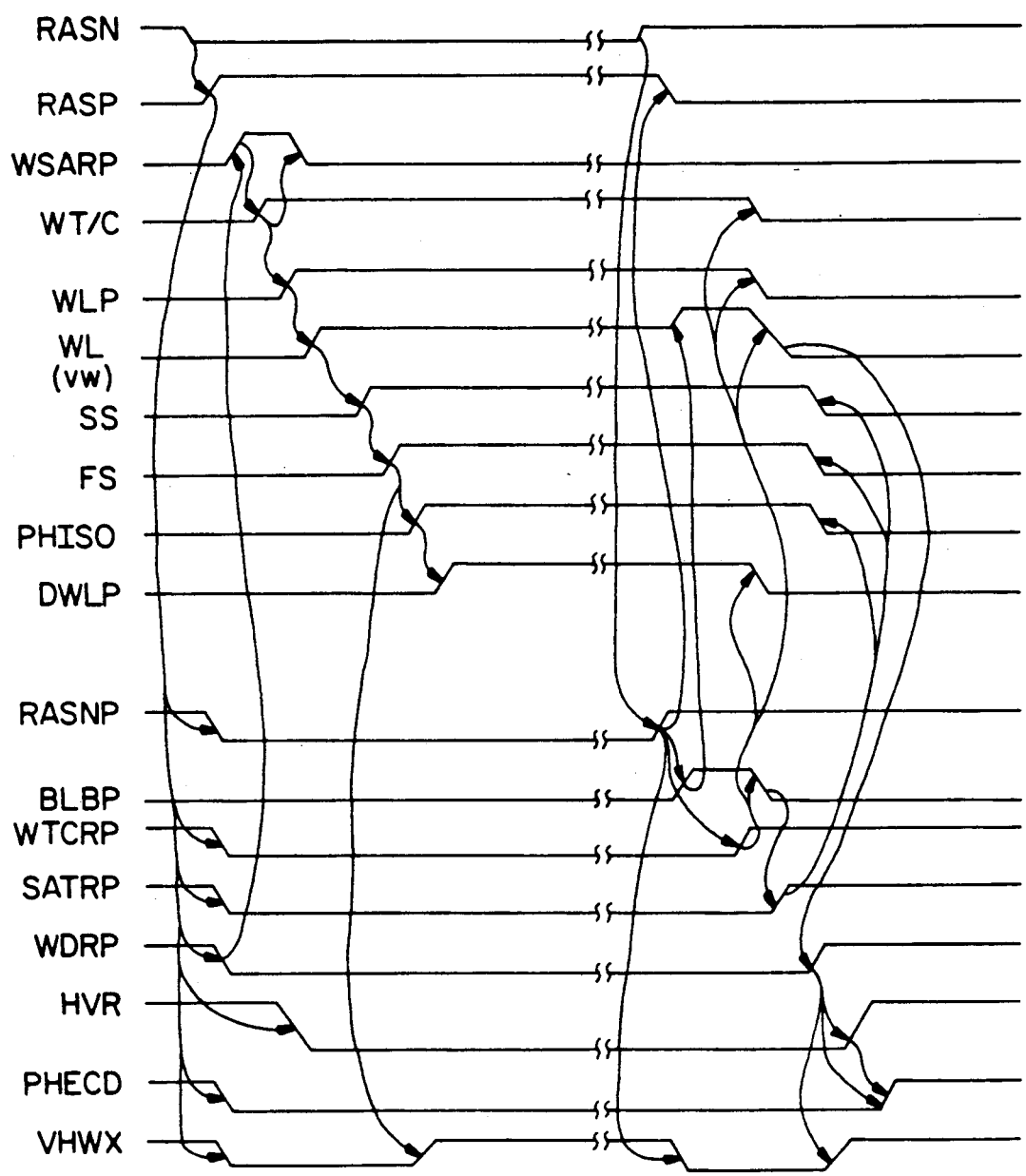
FIG. 8 is a timing phase diagram illustrating the relationship between the various timing signals used in the memory of the invention.

FIG. 7 show the most significant circuit of the invention, that of the VWKILL circuit. The VWKILL circuit is responsive to the signals generated by the redundant wordline decoder NOR circuits as designated by the inputs RNOR1-RNOR4. The redundant decoder outputs are coupled in pairs to the inputs of ENOR circuits formed by the cross-coupled devices 1 and 2 and 3 and 4, the outputs of which are commonly coupled to the gate of device 9. The output of the ENOR gates is precharged to the same Vdd-Vt as that of the RNOR inputs so that initially all of devices 1-4 are non-conductive. During a memory access cycle, if none of the redundant decoders are selected, all of the inputs to the ENORs will be discharged keeping the ENOR cross-coupled devices off such that the output remains high. This condition maintains device 9 conductive and sustains the voltage at its drain at ground. Devices 10-17 represent a filter circuit to prevent the VWKILL node from prematurely of momentarily rising. When the redundant decoders are all deselected, the voltage on the gates of devices 11, 13, 15, and 17 are all discharged allowing the output VWKILL to remain at ground.

The deselected redundant NOR nodes will discharge at different rates dependent upon the number of NOR devices pulling it low. Therefore, from redundant NOR node to redundant NOR node, skews in fall time will occur as determined by the memory address and the programmed address of the redundant decoders. These variations can cause any of the EXOR devices to momentarily conduct, if this occurs between inputs of the same EXOR subcircuit and causes the voltage difference to exceed a device threshold. If the conduction is sufficient, the voltage on the gate of device 9 can be momentarily caused to droop allowing the voltage on the drain to glitch positively when it is intended to remain low (unselected).

The filter stage is used to filter this potential glitch to an insignificant level. The filter works by using the redundant NOR nodes to enable pass devices 10, 12, 14 and 16 (one for each NOR node) which are connected in parallel and inserted between the drain of device 9 and the final output, VWKILL. When a normal wordline is selected, all four pass devices shut off isolating VWKILL. Since the occurrence of the glitch happens at the same time that the redundant NOR nodes are falling, a small amount of glitch leaks through. The pass devices turn off quickly enough that the level and duration of the glitch are reduced to insignificant levels.

When a redundant decoder is selected, one of the precharged redundant decoder outputs RNOR1-RNOR4 will remain charged causing one of the devices in the ENOR to which it is coupled to become conductive. This discharges the gate of device 9 allowing its drain to remain high. At the same time the RNOR output enables its respective filter pass device allowing the output of VWKILL to rise. As was previously described, VWKILL causes the first level wordline decoder circuits to inhibit the generation of VW1 and VW2 signals.

The usefulness of the VWKILL signal is that it is generated in between the driving of the word addresses on the internal chip address bus and the firing of the wordline clock driver.

It occurs early enough so that by the time that the slowest array word decoder is settled and the word line driver clock is firing or triggering, the VW decoders (FIG. 3) have been disabled to block the drive signal from the normal array word decoders In this way, redundant wordlines are invoked without any added delay to the access path and without allowing any leakage of the wordline drive phase to the array word decoders.

Key features of the invention include:

1. The access penalty steering of wordline drive through the redundant path and disabling of the normal array wordline drive path is accomplished within the inherent delay of the design.

2. The process of disabling the normal array wordline drive within the inherent design delay does not introduce glitches to the array wordline drive signal margins during redundant wordline selects.

3. The drive of the VWKILL signal is self timed off of the redundant word decoders for optimum process and voltage tracking.

4. The word line clock is multiplexed between the normal array word drive system and the redundant word drive system eliminating the need for additional word line drive clocks 5. The circuit requires very little active area over the normally needed redundant circuits/elements (fuses, decoders, wordlines, etc.).

6. The circuit power requirements are minimal.

The circuit of this invention represents an advancement in the implementation of word redundancy in DRAM designs. Redundant address detection and subsequent wordline drive steering are accomplished without adding any delay to the access path. Circuit area and power requirements are in keeping with the efficiencies demanded of cost/performance custom memories.

The circuit technique(s) described are extendable to a broad range of technologies (CMOS, bipolar, and GaAs) and designs (Display RAM's, SRAM's, etc.) and will be useful in maintaining a performance lead in the highly competitive area of memory design.

Thus, there has been described a novel wordline redundancy scheme in which the number of timing signals transitions and the time necessary to deselect the normal wordline select circuitry are minimized, thereby reducing the redundancy select time such that it can be guaranteed to occur within the time normally required for worse case wordline selection.

While the invention has been particularly shown and described with reference to the preferred embodiment thereof, it will be understood by those skilled in the art that various changes in the form and details of the device and method may be made therein without departing from the spirit and scope of the invention.

What is claimed is:

1. A semiconductor memory device comprising:
   a first array of memory cells organized as a plurality of rows and columns corresponding to wordlines and bit lines, each of the cells of the array being coupled to at least one bit line;
   a plurality of sensing means;
   means for coupling each bit line to a respective sensing means;
   an array of redundant memory cells, each of the cells of which being coupled to two of said bit lines; and
   bit line isolation means disposed in said bit lines between memory cells of the first array and redundant memory cells such that when redundant memory cells are being sensed the memory cells of the first array are isolated from those of the redundant array.

2. The semiconductor memory device of claim 1 wherein each of the redundant memory cells comprises two single device memory cells for storing complementary data signals.

3. The semiconductor memory system of claim 1 wherein said redundant memory cells are twin cells comprising a pair of capacitors for storing complementary data signals and including a pair of redundant wordline responsive devices coupled to a common redundant wordline.

4. The semiconductor memory system of claim 1 wherein said redundant wordline selection means can cause the selection of any redundant wordline in place of any wordline associated with the first array of memory cells.

* * * * *